US011122196B2

(12) United States Patent
Takao

(10) Patent No.: US 11,122,196 B2
(45) Date of Patent: Sep. 14, 2021

(54) IMAGE PROCESSING APPARATUS

(71) Applicant: CANON KABUSHIKI KAISHA, Tokyo (JP)

(72) Inventor: Yumi Takao, Nagareyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 39 days.

(21) Appl. No.: 16/781,478

(22) Filed: Feb. 4, 2020

(65) Prior Publication Data
US 2020/0374451 A1 Nov. 26, 2020

(30) Foreign Application Priority Data
Feb. 6, 2019 (JP) .............................. JP2019-020052

(51) Int. Cl.
 *H04N 5/232* (2006.01)
 *H04N 5/225* (2006.01)
 *H04N 5/369* (2011.01)
 *H04N 5/3745* (2011.01)

(52) U.S. Cl.
 CPC ....... *H04N 5/23212* (2013.01); *H04N 5/2253* (2013.01); *H04N 5/36961* (2018.08); *H04N 5/37455* (2013.01)

(58) Field of Classification Search
 CPC ............. H04N 5/23212; H04N 5/2253; H04N 5/232122; H04N 5/36961; H04N 5/37455; H01L 27/14607; H01L 27/14665; H01L 27/14627; G02B 3/00
 See application file for complete search history.

(56) References Cited

U.S. PATENT DOCUMENTS

| 9,385,148 | B2 | 7/2016 | Murata |
| 9,911,777 | B2 * | 3/2018 | Lee ..................... H01L 27/1463 |
| 10,014,333 | B2 * | 7/2018 | Velichko ........... H01L 27/14641 |
| 2017/0034425 | A1 * | 2/2017 | Hamano .......... H04N 5/232122 |
| 2019/0278006 | A1 * | 9/2019 | Tajima ............... G02B 27/4205 |
| 2021/0036036 | A1 * | 2/2021 | Kobayashi ......... H04N 5/37455 |

FOREIGN PATENT DOCUMENTS

| JP | 2013-145292 A | 7/2013 |
| JP | 5917158 B2 | 5/2016 |

* cited by examiner

*Primary Examiner* — Hung H Lam
(74) *Attorney, Agent, or Firm* — Cowan, Liebowitz & Latman, P.C.

(57) ABSTRACT

In order to provide an image processing apparatus that can obtain images having a plurality of F-numbers simultaneously by one shooting operation, the image processing apparatus includes an image pickup device, each pixel of the image pickup device has a micro lens for condensing light and a photoelectric conversion region provided beneath the micro lens, and the photoelectric conversion region includes an upper electrode and a lower electrode sandwiching a photoelectric conversion film and forms at least first to third regions that are divided and arranged in a plane parallel to the image pickup plane by the upper electrode or the lower electrode. Additionally, the first region has a shape for forming a circle, and the second and third regions are arranged outside the first region. Additionally, the image processing apparatus includes a readout unit that reads out photoelectric conversion signals obtained from one image pickup operation from each of the first to third regions.

15 Claims, 13 Drawing Sheets

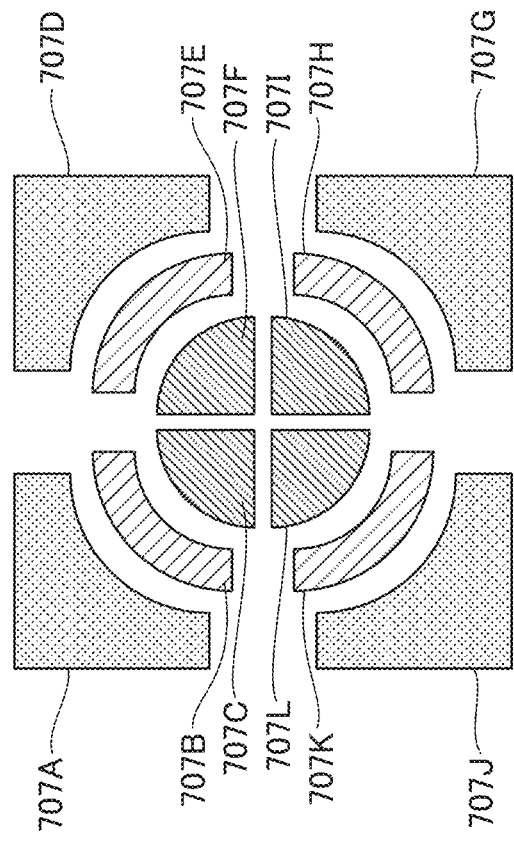
FIG. 11B
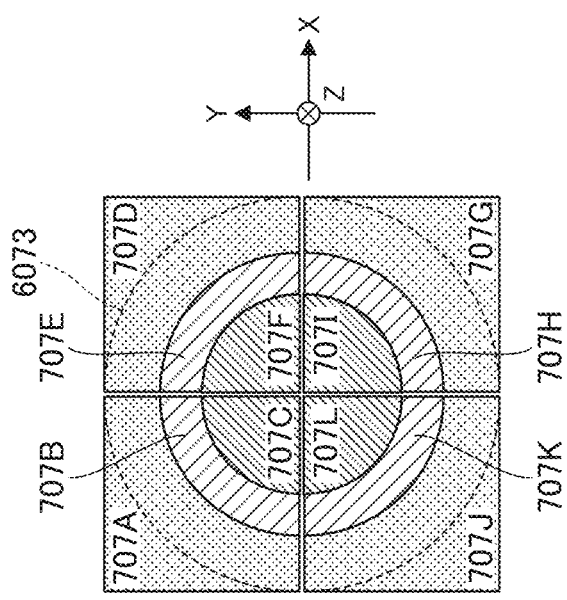
FIG. 11A
FIG. 11C
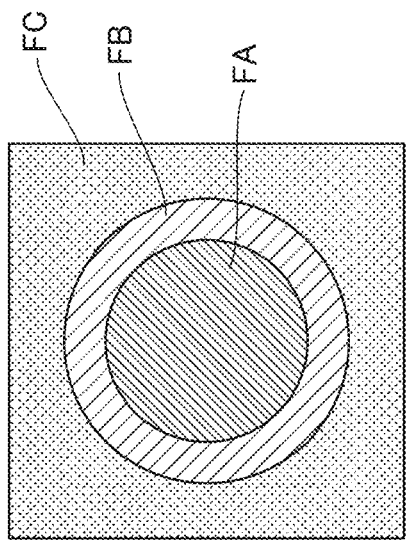
FIG. 11D

IMAGE PROCESSING APPARATUS

BACKGROUND OF THE INVENTION

Field of the Invention

The present invention relates to an image processing apparatus that is appropriate for obtaining images having different F-numbers.

Description of the Related Art

Recently, there has been proposed an image pickup apparatus that is provided with image pickup device that can obtain an image for image recording or display and can perform phase difference focus detection on an image pickup plane, in other words, image pickup device having what is referred to as an "image pickup plane phase difference AF function". Further, there has been proposed a camera that can acquire a plurality of pieces of light ray space information. Such a camera is referred to as, for example, a "light field camera". The light field camera can provide a function such as changing a focus position after shooting and obtaining images having different F-numbers (aperture values) by obtaining light fluxes that have passed through different pupil regions and reconstructing the image.

Additionally, in many cases, a CCD or a CMOS image pickup device or the like is used in an image pickup apparatus such as a digital still camera and a digital video camera. The image pickup device photoelectrically converts light that is incident to a photodiode for each pixel formed on a semiconductor substrate and reads out a signal amount for each pixel. Recently, in order to improve a light receiving sensitivity, a stacked image pickup device in which an organic photoelectric conversion film formed between a lower electrode and an upper electrode and a color filter are stacked has been disclosed. In an image pickup device having an organic photoelectric conversion film, setting a light receiving region of an image pickup device for receiving light of different pupil regions is relatively easier than in a conventional CCD or CMOS image pickup device. Specifically, there is the characteristic that the degree of freedom for pattern formation corresponding to the pupil region of the image pickup device is high because the light region can be set by a lower electrode pattern made of a metal material.

In an image pickup apparatus disclosed in Japanese Patent No. 05917158, a plurality of micro lens arrays are provided and a plurality of image pickup elements are provided beneath micro lenses so as to configure the above light field camera. A method for obtaining an image corresponding to a predetermined F-number of the image pickup device by changing readout of the image pickup device is also disclosed. Additionally, Japanese Patent Application Laid-open No. 2013-145292 discloses an image pickup device having an image pickup plane phase difference AF function realized by structures of lower electrodes, in an image pickup device having an organic photoelectric conversion film.

However, in the image pickup apparatuses disclosed in Japanese Patent No. 05917158 and Japanese Patent Application Laid-open No. 2013-145292, there is a drawback to be described below when acquiring images having different F-numbers. In the image pickup apparatuses disclosed in Japanese Patent No. 05917158 and Japanese Patent Application Laid-open No. 2013-145292, a divided shape of the image pickup element is rectangular, and thus, when an image formed by reading out of the image pickup element (for example, an image corresponding to a large F-number) is formed, a shape of blur becomes rectangular corresponding to the shape of the image pickup element. A mechanical diaphragm of a typical lens is changed so as to keep a round shape of aperture in accordance with the F-number. In contrast, a rectangular blur is not preferable.

SUMMARY OF THE INVENTION

An object of the present invention is to provide an image processing apparatus that can easily obtain a plurality of images corresponding to different F-numbers and can optimize a blur shape.

In order to solve the above problems, an image processing apparatus according to one aspect of the present invention comprises: an image pickup device configured to have a plurality of pixels arranged along an image pickup plane, the pixel having a micro lens for condensing light from outside into the pixel, and a photoelectric conversion region provided beneath the micro lens and for generating a photoelectric conversion signal, the photoelectric conversion region including an upper electrode and a lower electrode sandwiching a photoelectric conversion film, the upper electrode or the lower electrode being divided into a plurality of portions, and forming at least a first region, a second region, and a third region that are divided and arranged in a plane parallel to the image pickup plane by the divided upper electrodes or the lower electrodes, the first region having a shape for forming a circle, the second region and the third region being arranged outside the first region; and a readout unit configured to read out the photoelectric conversion signals obtained by one image pickup operation to serve as respectively first, second, and third signals from the first, second, and third regions.

Further features of the present invention will become apparent from the following description of experimental artifacts with reference to the attached drawings.

BRIEF DESCRIPTION OF THE DRAWINGS

FIGS. 11A-11D illustrate an example in which the pupil region is divided into many portions according to Embodiment 2.

DESCRIPTION OF THE EMBODIMENTS

Hereinafter, embodiments of the present invention will be described below in detail with reference to the drawings based on each embodiment.

Embodiment 1

Figure 1:
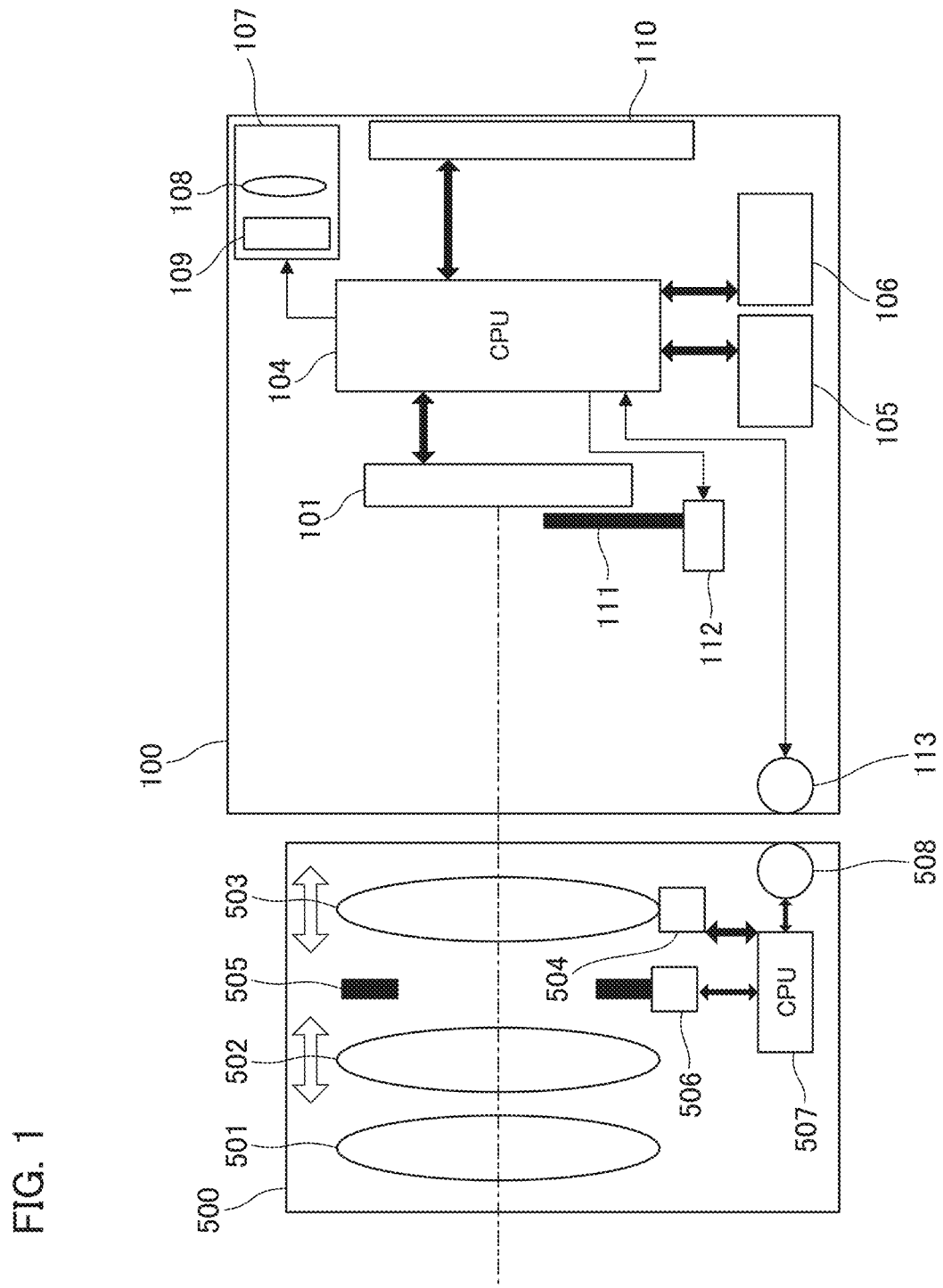
FIG. 1 is a block diagram of an image processing apparatus according to Embodiment 1.

FIG. 1 is a block diagram of a camera body 100 such as a lens-interchangeable digital camera and a shooting lens unit 500 to serve as an example of an image processing apparatus that embodies the present invention. The shooting lens unit 500 is configured to be attachable to and detachable from the camera body 100 and light fluxes transmitted through each lens group in the shooting lens unit 500 are guided to the image pickup device 101 for receiving an object image. In the image pickup device 101, a plurality of pixels that photoelectrically convert an object image into an electric signal are arranged in a matrix.

Various types of correction processing for acquiring an image signal and a focus detection signal, signal processing for converting the acquired image signal into a live-view image, an image for recording image, or an image for display on an EVF and the like are performed on the pixel information that has been converted into the electric signal. These processing are performed by a camera CPU 104. The camera CPU 104 performs various signal processing based on a computer program stored in a memory (not illustrated) and executes various operations for the overall image processing apparatus. Although in the present embodiment these processes and the like are performed by the camera CPU 104, a part of these processes may be performed by a dedicated circuit.

Reference numeral 105 is an operating member, which includes various members for setting a shooting mode and a shooting condition (for example, F-number, ISO, and exposure time) of the camera. Reference numeral 106 is a storage medium that is configured by a flash memory and the like, and functions as a storage means for recording shot still images and moving images. The storage medium 106 also has a function for individually storing signals for a plurality of pupil regions that have been read out from the image pickup device 101 or for storing signals after partially adding the signals. Reference numeral 107 is a viewfinder display, which is configured by a display 109 serving as a small and high-definition display means, such as an organic EL display or a liquid crystal display, and an eyepiece lens 108. As an external display device 110, an organic EL display or a liquid crystal display having a screen size that is suitable for naked eye vision is used. Various types of information, such as a setting state of the camera body 100, a live view image, and a shot image, are displayed on the viewfinder display 107 and the external display device 110.

A focal plane shutter 111 is disposed in front of the image pickup device 101. A shutter driving unit 112 includes, for example, a motor, and controls an exposure time of the image pickup device 101 when capturing a still image by driving and controlling shutter blades. A camera-side communication terminal 113 is provided on a camera mount unit for mounting a shooting lens unit. The camera-side communication terminal 113 transmits and receives various types of information between the camera CPU 104 and a lens CPU 507, which will be described below, together with a lens-side communication terminal 508 provided on the lens mount unit.

The shooting lens unit 500 is attachable to and detachable from the camera body 100 and, in the present embodiment, it has a zoom lens by which a focal length is variable. Any type of lens can be used. The light flux from the object passes through a first lens group 501, a second lens group 502, and a third lens group 503, and forms an object image on an image pickup plane of the image pickup device 101 in the camera body 100. The second lens group 502 functions as a variator that moves back and forth in the optical axis direction to change magnification. The third lens group 503 functions as a focus lens that moves back and forth in the optical axis direction to perform focus adjustment.

The third lens group 503 is driven by a focus driving unit 504 that includes a stepping motor. A diaphragm 505 is used for adjusting an amount of light incident to the image pickup device 101 via the shooting lens unit, and is configured by a plurality of diaphragm blades. A diaphragm driving unit 506 drives the diaphragm blades to drive the diaphragm until a predetermined F-number is achieved. The lens CPU 507 communicates with the camera CPU 104 via the lens-side communication terminal 508 and the camera-side communication terminal 113 to transmit and receive various types of information and controls the focus driving unit 504 and the diaphragm driving unit 506 based on a command from the camera CPU 104.

Although a zoom range and an open F-number of the shooting lens unit 500 are designed in accordance with a shooting intention, in the present embodiment, the open F-number is set to a constant value regardless of a zooming state and a focusing state. In contrast, a distance between an exit pupil and an image pickup plane, in other words, what is referred to as an "exit pupil distance", changes in accordance with the zooming state and the focusing state.

Figure 2:
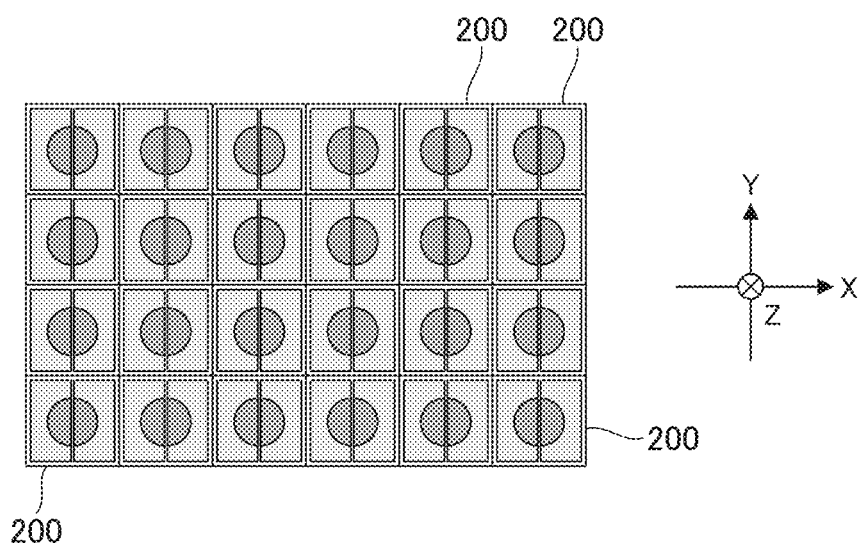
FIG. 2 illustrates an example of pixel arrangement of image pickup device according to Embodiment 1.

FIG. 2 is a plan view of a part of a plurality of pixels 200 in the vicinity of the center of the image pickup plane of the image pickup device 101 (in the vicinity of the optical axis of the shooting lens that is in the vicinity of the image height 0) as viewed from the imaging lens unit side. In FIG. 2, the pixels 200 included in the image pickup device 101 are respectively square-shaped pixels having the size of 4 µm in both the horizontal direction (x) and the vertical direction (y) on the image pickup plane, and the structure of these pixels is substantially the same. These pixels are, for example, arranged in a matrix of 6,000 pixels in the horizontal direction and 4,000 pixels in the vertical direction. The size of the image pickup region can be obtained by multiplying the size of the pixels, in other words, the pixel pitch, by the number of pixels, and in this case, it is 24 mm in the horizontal direction and 16 mm in the vertical direction. RGB Color filters are arranged in each pixel, where what is referred to as "Bayer arrangement" is formed as a whole.

Figure 3:
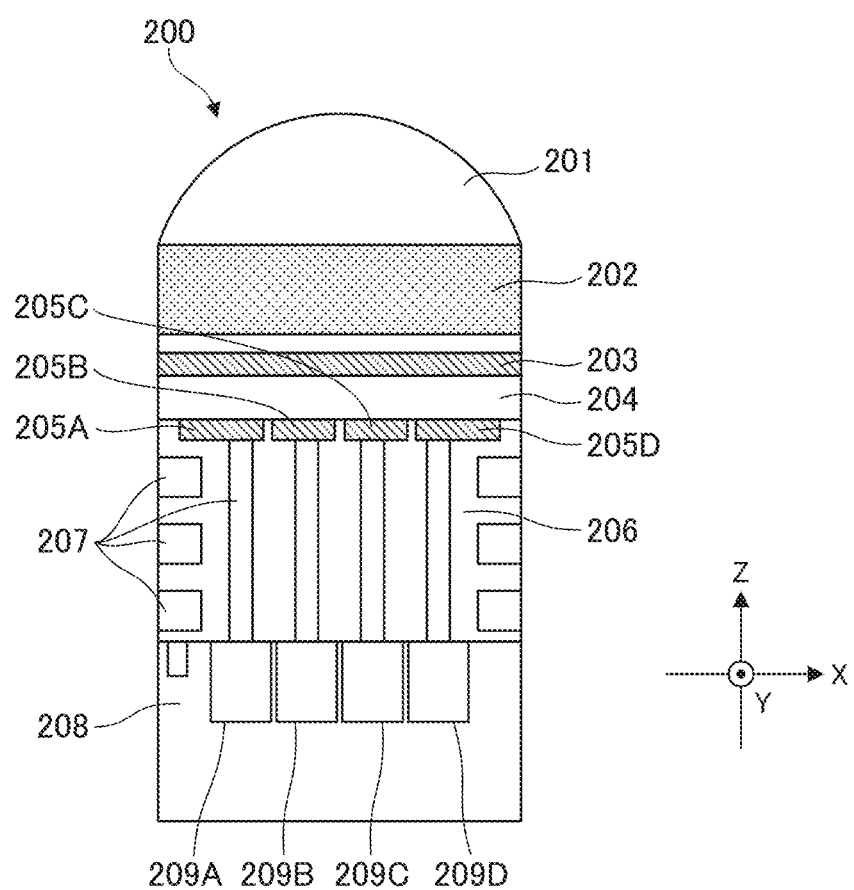
FIG. 3 illustrates a sectional view of pixels of the image pickup device according to Embodiment 1.

FIG. 3 is a sectional view in the x-direction passing through the center of one pixel of the pixel group. The pixel 200 has a micro lens 201, a color filter 202, an upper electrode 203, an organic photoelectric conversion film 204, and transparent lower electrodes 205A to 205D. The micro lens 201 condenses light, which is imaged on the image pickup device 101 after passing through the shooting lens unit 500, onto an inside of the pixel 200. The color filter 202 is provided beneath the micro lens 201 and is configured to transmit only light having a specific wavelength of, for example, R (red system), B (blue system), or G (green system) for each pixel 200.

The upper electrode 203 (first electrode) is provided beneath the color filter 202 and on the organic photoelectric conversion film 204. The organic photoelectric conversion film 204 is provided beneath the upper electrode 203 and generates electric charges that serve as photoelectric conversion signals by photoelectric conversion of light. The lower electrodes 205A to 205D are second electrodes arranged separately in the x direction and are provided beneath the organic photoelectric conversion film 204 so as to face the upper electrode 203. The lower electrode is divided and arranged in a plane parallel to the image pickup plane. The color filter 202 is provided between the micro lens 201 and the upper electrode 203. The upper electrode 203 is provided between the color filter 202 and the organic photoelectric conversion film 204. The organic photoelectric conversion film 204 is provided between the upper electrode 203 and the lower electrodes 205A to 205D.

In each pixel 200, only light having a specific wavelength (R, G, or B) condensed by the micro lens 201 and transmitted through the color filter 202 is photoelectrically converted by the organic photoelectric conversion film 204 to generate signal electric charges. Subsequently, a bias voltage is applied between the upper electrode 203 and the lower electrodes 205A to 205D so as to form an electric field in the organic photoelectric conversion film 204, whereby a signal electric charge that is transferred to the lower electrode 205 can be read out to the outside. That is, the photoelectric conversion signal that has been generated in the organic photoelectric conversion film is read out for each region corresponding to the shape of the lower electrodes 205A to 205D. That is to say, a photoelectric conversion region in accordance with the shape of the lower electrode is formed. In the present embodiment, the "photoelectric conversion region" denotes a region formed by the divided lower electrode together with the upper electrode and the organic photoelectric conversion film. Note that the upper electrode may be divided into a plurality of electrodes. Therefore, the photoelectric conversion region may be divided into a plurality of regions by the divided upper electrodes.

The upper electrode 203 is transparent and allows light to enter into the organic photoelectric conversion film 204 from the micro lens 201. The material of the transparent upper electrode 203 is preferably a transparent conductive oxide such as ITO (indium tin oxide). Additionally, the upper electrode 203 may be divided for each pixel 200 or may be shared for all the pixels 200.

The lower electrodes 205A to 205D are metal electrodes having the function for reflecting light. Examples of the material of the lower electrodes 205A to 205D include Al and Ti. The lower electrodes 205A to 205D reflect light incident from the organic photoelectric conversion film 204 to the organic photoelectric conversion film 204. The organic photoelectric conversion film 204 is made of a photoelectric conversion material that absorbs light and generates electric charges in accordance with an amount of absorbed light. The organic photoelectric conversion film 204 may have a single-layer structure or a multi-layer structure. An insulating film 206 and a metal wiring 207 are provided beneath the lower electrodes 205A to 205D. The metal wiring 207 is an electric wiring portion for reading signal electric charges or switching signals, and the lower electrodes 205A to 205D are respectively connected to the signal reading units 209A to 209D on the Si substrate. Note that the signal electric charges that have been generated in the organic photoelectric conversion film 204 and transferred to the lower electrode 205 are accumulated in the corresponding signal reading units 209A to 209D via the metal wiring 207. Specifically, a still image and a moving image are generated by signals acquired based on the signal electric charges accumulated in the signal reading units 209A to 209D during a predetermined exposure period of time.

The insulating film 206 is formed between a plurality of metal wirings 207 and between a plurality of lower electrodes 205A to 205D. Thus, the insulating film 206 provides electrical insulation between the metal wirings 207 and between the lower electrodes 205A to 205D. An impurity region corresponding to the pixels 200 is formed in a semiconductor substrate 208 and holds the signal electric charges that have been generated by the organic photoelectric conversion film 204. Further, a circuit for reading out signal electric charges (not illustrated) is formed on the semiconductor substrate 208.

Figure 4:
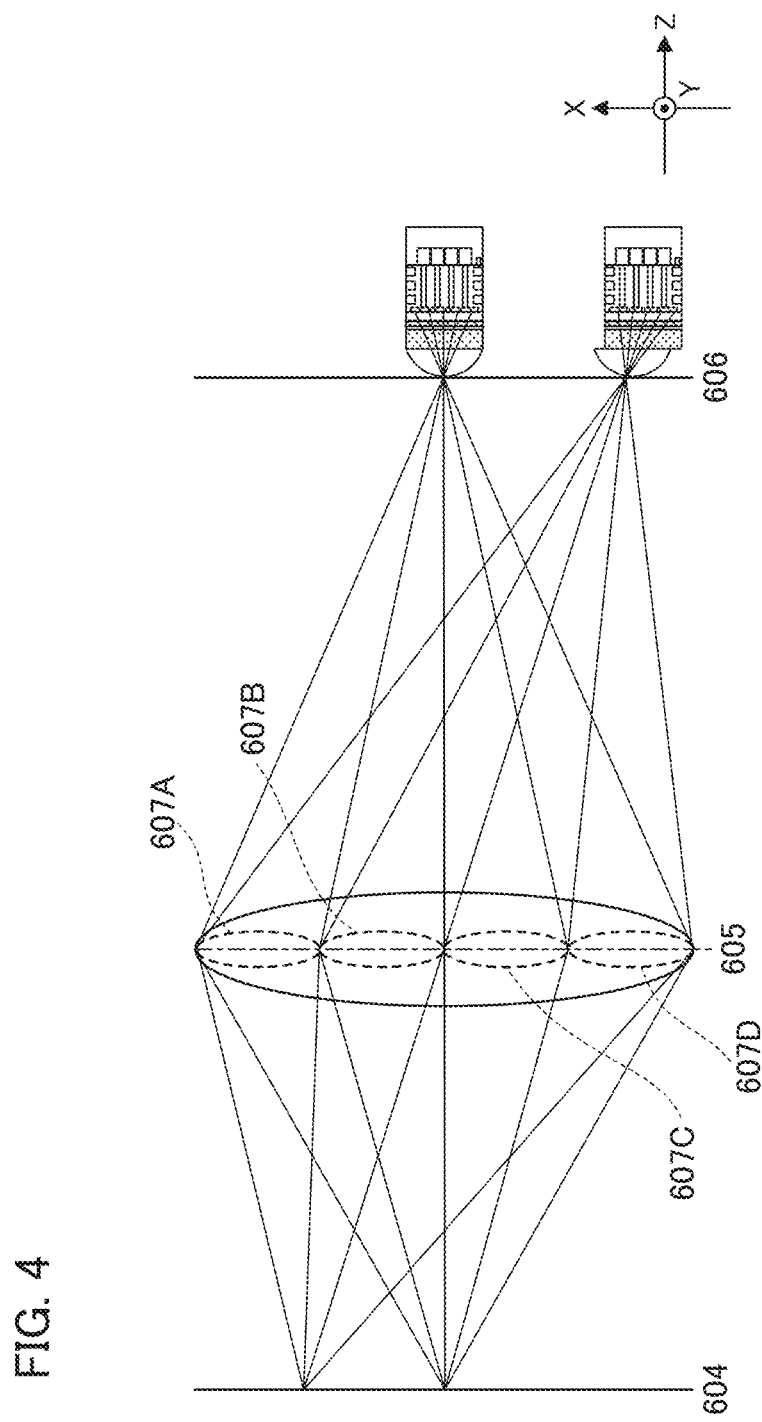
FIG. 4 is a schematic diagram illustrating the correspondence between the image pickup device and the pupil division according to Embodiment 1.

Next, FIG. 4 illustrates the correspondence relation between the image pickup device and the pupil division in the present embodiment. A line 604 indicates the position of the object, and an object image is formed on an image pickup plane 606 of the image pickup device through the image pickup optical system located at a position 605. Note that in this context, the imaging optical system represents a lens group included in the shooting lens unit as one lens. The photoelectric conversion film portions each corresponding to each of the lower electrodes 205A to 205D divided into four portions in the x direction for each pixel of the image pickup device receive a light flux that has passed through pupil regions 607A to 607D shown by a dotted line.

In the present embodiment, a parallax image corresponding to a specific pupil region in the pupil regions 607A to 607D of an image-formation optical system can be obtained by selectively selecting a signal of a specific photoelectric conversion portion from among the photoelectric conversion film portions corresponding to the lower electrodes 205A to 205D for each pixel. For example, a parallax image having a resolution for the effective pixel number corresponding to the pupil region 607A of the image-formation optical system can be acquired by selecting a signal of the photoelectric conversion film portion corresponding to the lower electrode 205A for each pixel.

Additionally, it is possible to generate a captured image having a relatively high sensitivity with a resolution for the effective pixel number by adding all or part of the signals of the photoelectric conversion portions corresponding to the photoelectric conversion film portions corresponding to the lower electrodes 205A to 205D for each pixel.

Figure 5A:
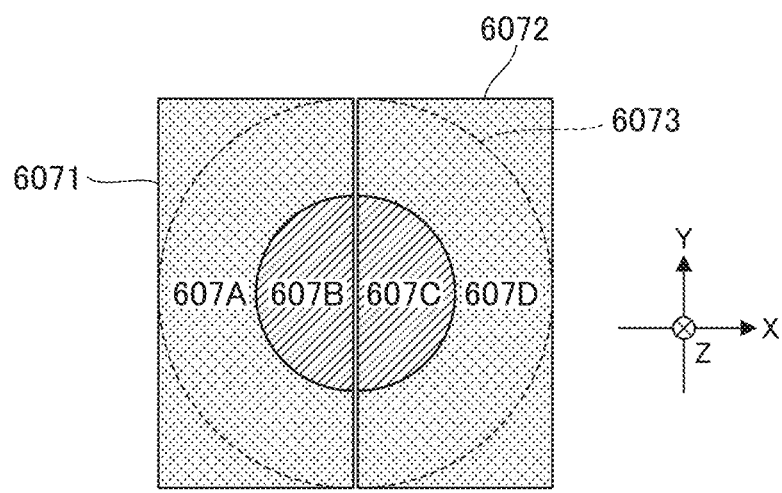
FIGS. 5A and 5B illustrate an example of a pattern of a pupil region of an imaging optical system according to Embodiment 1.
Figure 5B:
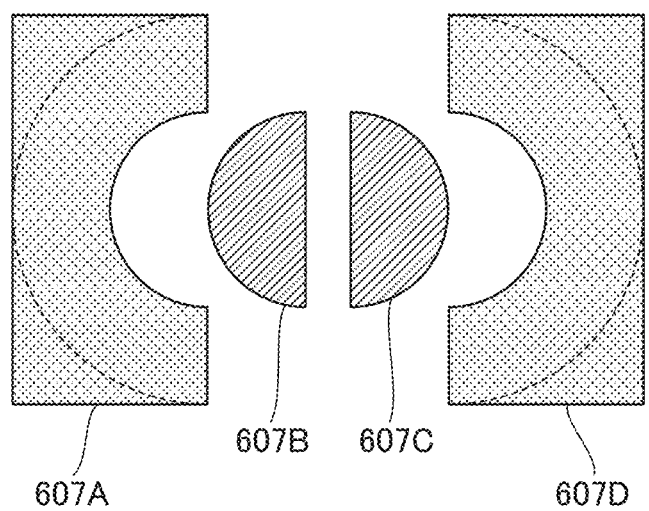

FIG. 5A is a schematic diagram illustrating the pupil regions 607A to 607D of the imaging optical system on the xy plane. A pupil region 6073 shown by a dotted line is a circular pupil region determined (restricted) by the diaphragm within the overall pupil region configured by the pupil regions 607A to 607D in a manner similar to those in FIG. 4. Each of the pupil regions 607A to 607D represents a pupil region determined by the shapes of the lower electrodes 205A to 205D. That is, the pupil region shape (pupil pattern) shown in FIG. 5B in a broken-down manner is determined in accordance with the shape of the lower electrodes 205A to 205D of the pixel 200 shown in FIG. 3. Note that vignetting occurs due to the lens diaphragm in a portion outside the periphery of the pupil regions 607A and 607D. In the present embodiment, as shown in FIG. 5B, a pupil pattern divided into 4 parts and consisting of pupil regions 607B and 607C (hatched portion) and 607A and 607D (dot portion) each having a substantially semicircular shape is illustrated. The 607A and 607D have a shape obtained by respectively removing 607B and 607C from the rectangles 6071 and 6072.

Additionally, the lower electrodes 205A to 205D respectively have shapes that are similar to the shapes of the corresponding pupil regions, and as described above, photoelectric conversion regions in which the lower electrode is divided together with the upper electrode and the organic photoelectric conversion film 204 are formed. That is, the divided pupil regions shown in FIG. 5A may be considered to have a shape substantially similar to the shape of the divided lower electrodes 205A to 205D (a shape of the divided photoelectric conversion region). Additionally, in the description below, for example, all of the divided pupil regions to be described with reference to FIG. 7, FIGS. 10A-10D, FIGS. 11A-11D, and FIGS. 13A-13C may be considered to have a shape similar to the shape of the divided lower electrode (the shape of the divided photoelectric conversion region). As described above, since the pupil pattern can be determined by the lower electrode that is a metal material, the image pickup device according to the present embodiment that uses a photoelectric conversion film has higher degree of freedom when designing the pupil pattern than a conventional CCD or CMOS image pickup device. Additionally, there is the characteristic that the pupil pattern can be easily formed even in a complicated shape such as an arc.

Figure 13A:
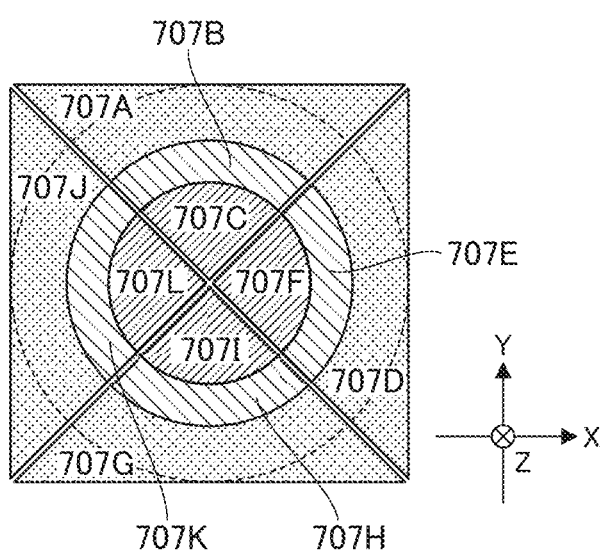
FIGS. 13A-13C illustrate a modification of the pupil division according to Embodiment 2.
Figure 13B:
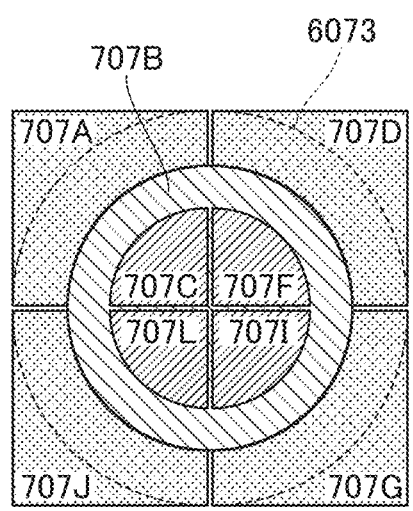
Figure 13C:
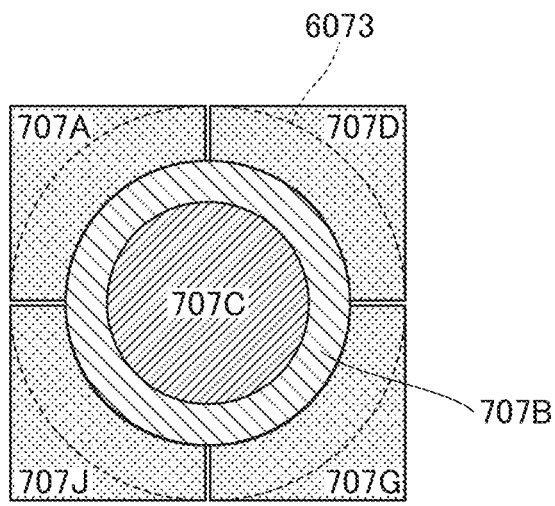

As described above, in the present embodiment, semicircular lower electrodes 205B and 205C each having a shape that is similar to the pupil regions 607B and 607C are provided in order to constitute the semicircular pupil regions 607B and 607C. Lower electrodes 205A and 205D that are respectively shaped similarly to the pupil regions 607A and 607D are provided outside the lower electrodes 205B and 205C. A photoelectric conversion region (first region) formed by the semicircular lower electrodes 205B and 205C has a shape for forming a circle by the combination of both. In the example of FIG. 5A, although the lower electrodes 205B and 205C are divided, the photoelectric conversion region (first region) for forming a circle may not be divided as shown in FIG. 10D and FIG. 13C, which will be described below, or may be further divided into smaller parts as shown in FIG. 11A. Note that in the above description, the circle does not have to be perfectly circular, and, for example, it may be slightly oval.

Additionally, the lower electrodes 205A and 205D for forming divided photoelectric conversion regions (second region, third region) are disposed outside the photoelectric conversion region (first region) for forming a circle as described above. Note that in the example shown in FIG. 5A, although one each of the lower electrodes 205A and 205D for forming the divided photoelectric conversion regions (second region, third region) are provided, they may be further divided into smaller portions as shown in FIG. 11A and FIGS. 13A-13C.

Additionally, in the present embodiment, as shown in FIG. 4, as the pixel is located farther from the center of the image pickup device, the position of the micro lens is shifted to the optical axis side of the optical system with respect to the pixel. This is in order to correspond to an inclination of the direction of the principal ray because, in a portion far from the center of the image pickup device, the direction of the principal ray from the image-forming optical system is more inclined.

Figure 6:
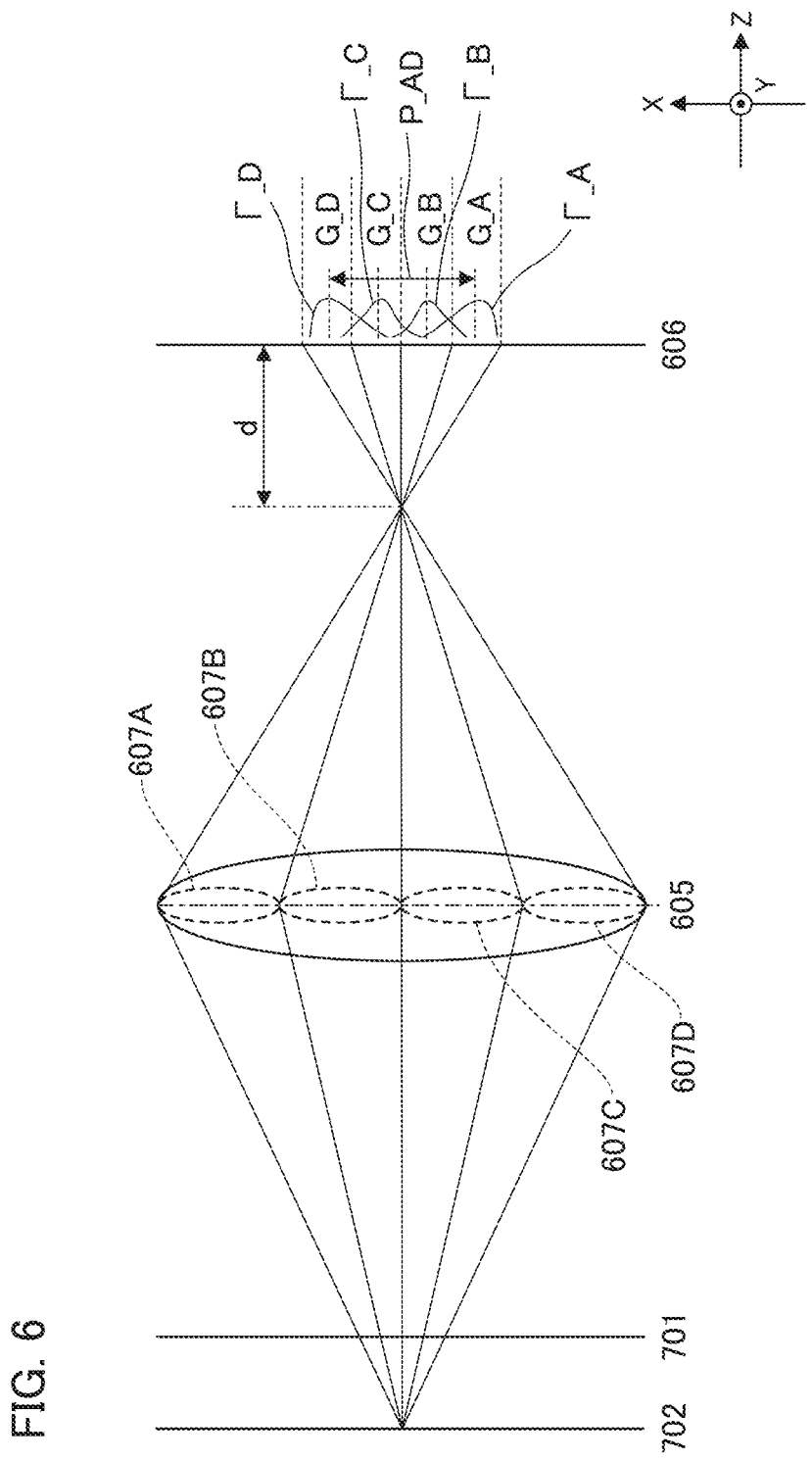
FIG. 6 is a schematic diagram illustrating the relation between an amount of image shift and an amount of defocusing according to Embodiment 1.

Next, FIG. 6 illustrates a schematic relation between an amount of image shift between parallax images in each pixel and an amount of defocusing. Each of the micro lenses 201 of the image pickup device 101 in the present embodiment are arranged on the image pickup plane 606, and light from the pupil region 607A to the pupil region 607D of the image forming optical system enters in a manner similar to that in FIG. 4.

The defocus amount d is defined to have a magnitude $|d|$ of the distance between the image forming position of the object and the imaging plane. Also, a negative sign ($d<0$) is given when in a front-focused state in which the image forming position of the object is on the object side relative to the imaging plane, and a positive sign ($d>0$) is given when in a rear-focused state in which the image forming position of the object is on the side opposite to the object relative to the imaging plane. When in an in-focus state in which the image forming position of the object is on the imaging plane (in-focus position), $d=0$. In FIG. 6, an object 701 is an example of the in-focus state ($d=0$), and an object 702 is an example of the front-focused state ($d<0$). The front-focused state ($d<0$) and the rear-focused state ($d>0$) will be collectively referred to as a "defocused state ($|d|>0$)".

In the front-focused state ($d<0$), each light flux that has passed through the pupil regions 607A to 607D, from among the light fluxes from the object 702, is condensed once and expanded to a width F centered on the centroid position G_A to G_D of each light flux to form an image blurred on the image pickup plane 606 (blur image). The blur image Γ_A to Γ_D of each light flux is received by the photoelectric conversion film portion corresponding to the lower electrode 205, and thereby a parallax image is generated.

With the increase in the size "$|d|$" of the defocusing amount d, the blur image Γ_A to Γ_D of the object image is generally widened in a direction parallel to the image pickup plane 606 in a proportional manner. Similarly, with the increase in the size "$|d|$" of the defocusing amount d, the size of the image shift amount p_AD (=G_D−G_A) of the object image between parallax images "$|p|$" generally increases in a proportional manner. The front-focused state being applied to the rear-focused state ($d>0$), in which the direction of image shift of the object image between parallax images is opposite to the front focus state, is similar. In the in-focus state ($d=0$), the centroid position of the object image between the parallax images coincides ($p=0$), and image shift does not occur.

At this time, the image shift amount p may be calculated as G_D−G_A or may be calculated as G_C−G_B. Alternatively, the image shift amount may be calculated as (G_C+G_D)−(G_B+G_A). The above three calculation methods may be selectively switched in accordance with the defocusing amount (size of $|d|$) or addition may be performed after changing the weighting of the above three calculation results. In focus detection, the defocusing amount d is calculated by multiplying the image shift amount p between parallax images by a known conversion coefficient K. Additionally, a lens driving amount is determined based on the relation between the defocusing amount and the third lens group 503 serving as a focus lens, and the image pickup plane phase difference focus adjustment is performed by operating the focus driving unit 504. The above operation is executed by the focus detecting means in the present embodiment.

As described above, the amount of image shift between two or more (a plurality of) parallax images acquired by using the photoelectric conversion film portion corresponding to the lower electrode 205 increases with the increase in the amount of defocusing. In the present embodiment, the amount of image shift between parallax images is calculated by using a correlation calculation by using signals from the photoelectric conversion unit of the image pickup device. Accordingly, it is possible to perform focus detection by using a focus detection signal of the image pickup plane phase difference detection method. Thus, phase difference focus detection becomes possible by forming a pupil pattern having a parallax.

Figure 7:
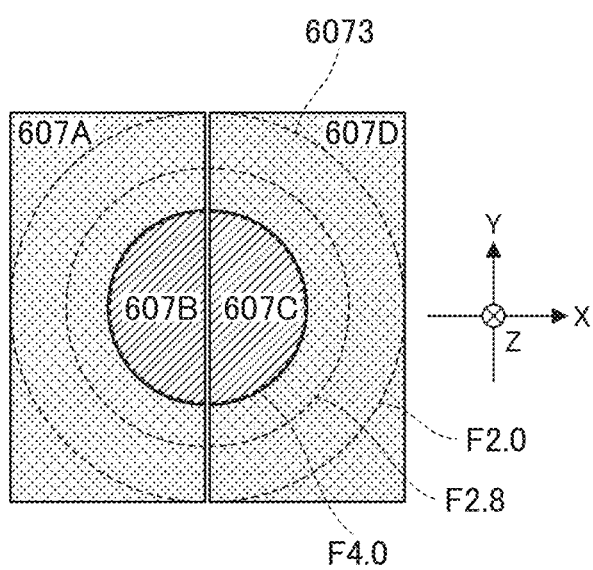
FIG. 7 illustrates the relation between the pupil region and the F-number according to Embodiment 1.

Next, with reference to FIG. 7, the relation between captured images having a plurality of F-numbers that can be acquired in the present embodiment and a parallax image for focus detection will be described. FIG. 7 illustrates the relation with the F-number shown by a dotted line in the pupil region pattern shown in FIG. 5A. The pupil region 6073 is a pupil region determined by an open diaphragm of the shooting lens unit 500. For example, if the open F-number of the shooting lens unit is F 2.0, a pupil region having F 2.8 (first-step aperture), and a pupil region having F 4.0 (second-step aperture) are respectively shown by dotted lines in FIG. 7. Upon obtaining an addition output of the pupil region 607A+the pupil region 607B+the pupil region 607C+the pupil region 607D in an open aperture state, a shooting image for image recording or image display having the open F-number F 2.0 can be acquired.

Note that, in order to acquire such an addition output, an image pickup (shooting) operation is performed once by using the image pickup device to form photoelectric conversion signals in the image pickup device. Subsequently, the photoelectric conversion signals (first to third signals) from the photoelectric conversion regions (first region to third region) corresponding to each of the pupil regions are read out. This readout is performed under the control of the camera CPU 104. At this time, the camera CPU 104 functions as a readout unit. AD conversion is performed on the signals that have been read out by an AD converter (not illustrated), signal processing is appropriately performed to the AD-converted signals, and then the signals are temporarily stored in the storage medium 106. Then, addition processing is performed on the temporarily stored signals corresponding to each pupil region by an arbitrary combination. Note that a part of the signals corresponding to each pupil region may be added inside the image pickup device or outside the image pickup device in advance before being stored in the storage medium 106. Alternatively, all the signals corresponding to each pupil region may be separately stored in the storage medium 106.

Figure 8:
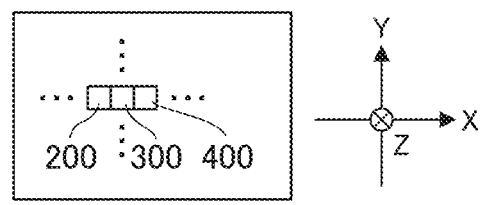
FIG. 8 illustrates an example of pixel arrangement according to Embodiment 1.
Figure 9:
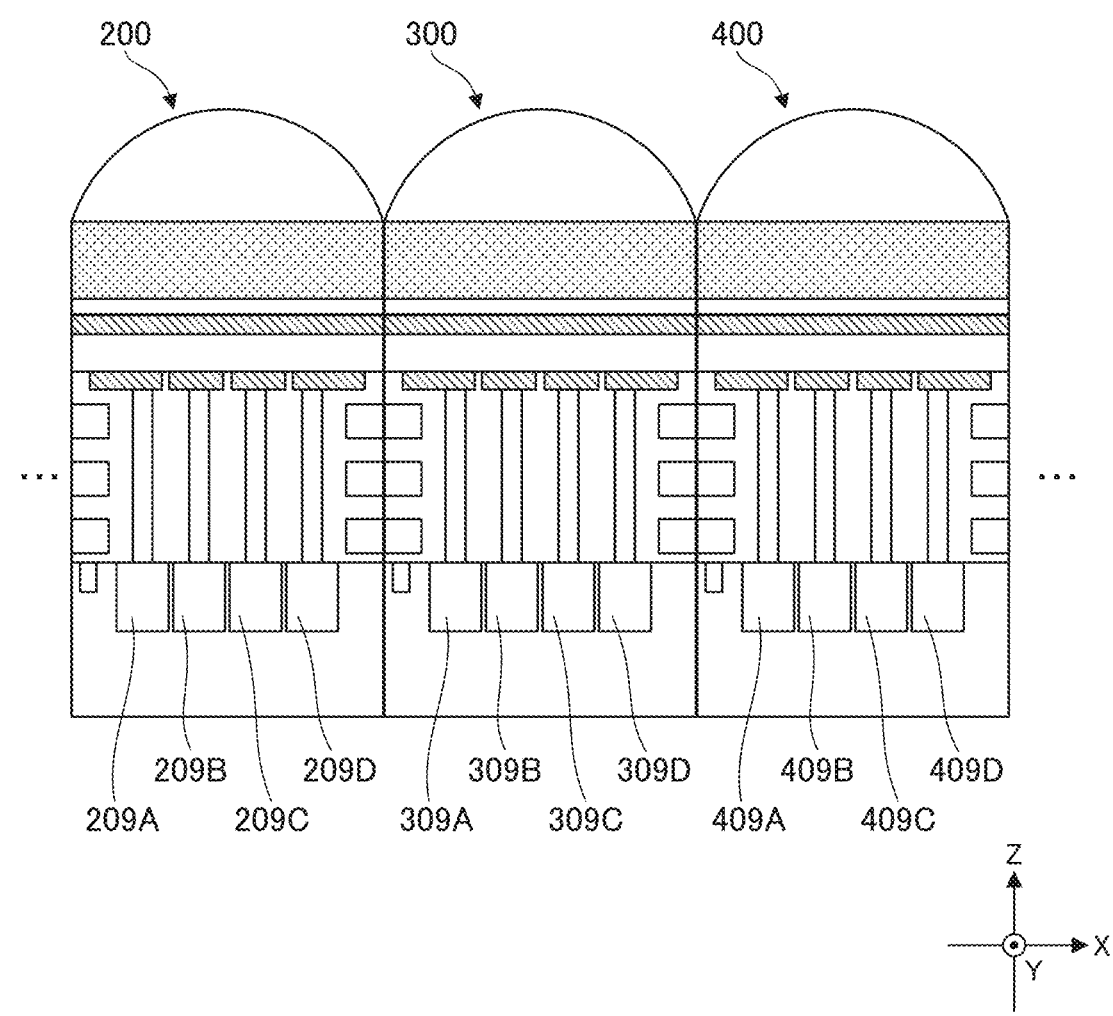
FIG. 9 is a sectional view of the pixels in the pixel arrangement of FIG. 8.

FIG. 9 illustrates a cross-sectional structure of the pixels in the x-direction passing through the pixel center when the pixels 200, 300, and 400 are arranged in line as shown in FIG. 8. Additionally, the signals from the signal reading units 209A to 209D of the pixel 200 are respectively defined as 209AS to 209DS. Additionally, the signals from the signal readout units 309A to 309D of the pixel 300 are respectively defined as 309AS to 309DS. Additionally, the signals from the signal reading units 409A to 409D of the pixel 400 are respectively defined as 409AS to 409DS.

For example, in the first mode, the signals 200AS+209BS+209CS+209DS are read from the pixel 200, the signals 300AS+309BS+309CS+309DS are read from the pixel 300, the signals 400AS+409BS+409CS+409DS are read from the pixel 400 . . . , and such reading processing is continued until the readout for all pixels is completed (in the present embodiment, for example, it is assumed that 4,000× 6,000 pixels are arranged), and thereby, a shooting for image recording or image display corresponding to the open F-number (F2.0) is obtained. Specifically, in the first mode, an image signal having a relatively high sensitivity can be formed by adding the first to third signals corresponding to the first to third regions.

In contrast, for example, in the second mode, the signals 209BS+209CS are read from the pixel 200, the signals 309BS+309CS are read from the pixel 300, the signals 409BS+409CS are read from the pixel 400 . . . , and such reading processing is continued until the readout for all pixels is completed (in the present embodiment, for example, it is assumed that 4,000×6,000 pixels are arranged.), thereby to obtain a shooting image for image recording or image display corresponding to the open F-number (F4.0). Specifically, instead of using the second and third signals among the first to third signals that correspond to the first to third regions, in the second mode, an image signal having a relatively low sensitivity is formed by forming a second image signal by using the first signal corresponding to the first region.

Note that the operation for selecting the first or second mode in the formation of such an image signal is performed based on, for example, object brightness information (photometric information). That is, for example, if it is determined that the object is relatively dark based on the photometric information, the first mode is selected, and in contrast, if it is determined that the object is relatively bright, the second mode is selected. Note that, in the present embodiment, the selection of the first or second mode is executed by the camera CPU 104, and at this time, the camera CPU 104 functions as an image processing means.

Note that the image signal forming operation in the first and second mode may be executed by reading out the first to third signals from the image pickup device, performing AD-conversion, storing the AD-converted signals in the storage medium, and appropriately combining the first to third signals from the storage medium. Moreover, in the present embodiment, the lower electrodes 205B, 205C and the like are each formed to be substantially semicircular such that the pupil shape also has a substantially circular shape in a manner similar to the shape in which the diaphragm 505 is narrowed, to acquire a substantially circular blur shape, and as a result, a shooting image having a preferable blur shape can be obtained. According to the present embodiment, the lower electrodes 205B and 205C are formed to be substantially circular corresponding to the pupil regions 607B and 607C in FIG. 5A and FIG. 7, and as a result, blurring can be optimized.

Conventionally, there has been a necessity to shoot a plurality of images by operating the diaphragm driving unit 506 in the shooting lens unit 500 each time, in the acquisition of images having different F-numbers. However, in the present embodiment, it is possible to acquire images having different F-numbers by one shooting operation simply by changing the combination of the addition signals from the signal readout unit as described above, while changing the diaphragm by the diaphragm driving unit 506, instead of shooting a plurality of times. Alternatively, images having different F-numbers obtained by one shooting operation may be acquired by temporarily storing the signals that have temporarily been read out from the signal readout unit in the storage unit, and then changing the combination of the addition signals.

Additionally, in focus detection, for example, control is performed as below. That is, signals 209AS and 209DS are respectively read out to serve as, for example, a right pixel signal and a left pixel signal from the pixel 200. The signals 309AS and 309DS are respectively read out to serve as, for example, a right pixel signal and a left pixel signal from the pixel 300. Then, signals 409AS and 409DS are respectively read out to serve as, for example, a right pixel signal and a left pixel signal from the pixel 400. Such an operation is continued in order to obtain, for example, a right image signal and a left image signal from pixels of one row. Subsequently, a focus detection signal is generated by detecting a phase difference between the right image signal and the left image signal, and an object distance is calculated. The same applies to the other rows. In the present embodiment, a focus detection signal is generated based on the third signal from the third region and the fourth signal from the fourth region within the photoelectric conversion region. The generation of such a focus detection signal is controlled by the camera CPU 104. At this time, the camera CPU 104 functions as a focus detection means.

Figure 10A:
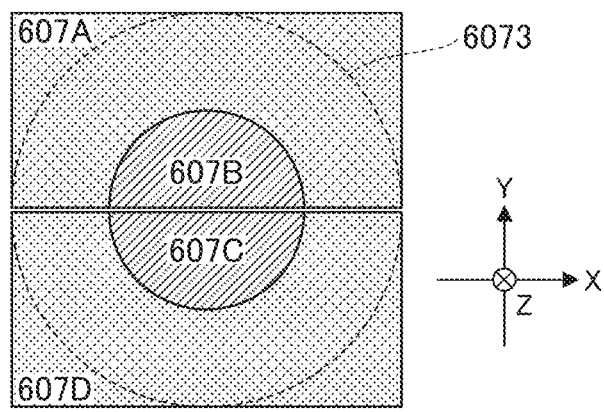
FIGS. 10A-10D illustrate another example of a pattern of the pupil region.
Figure 10C:
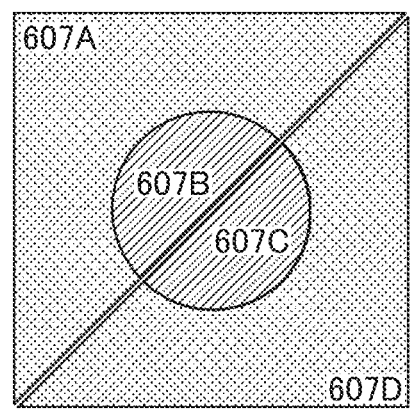
Figure 10B:
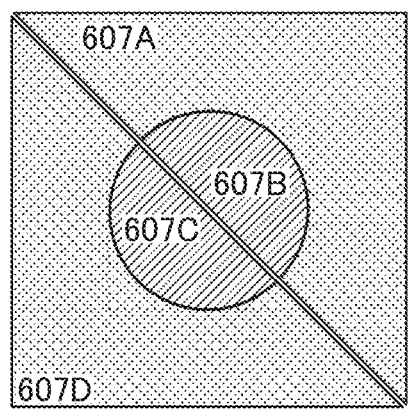
Figure 10D:
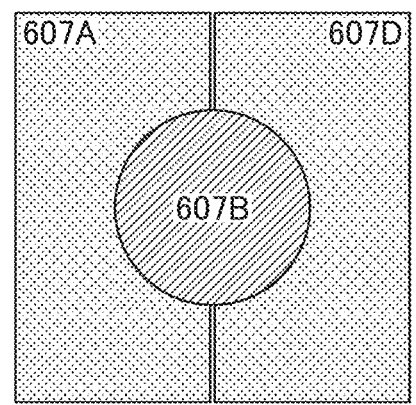

Further, as shown in FIG. 10A, the pattern shape of the lower electrode can also be configured so as to have a shape in which the pupil pattern is rotated by 90 degrees with respect to FIG. 7. As shown in FIG. 10B and FIG. 10C, the pattern shape of the lower electrode can also be configured so as to have a shape in which the pupil pattern is rotated by +45 degrees or −45 degrees with respect to FIG. 7. In FIG. 7, FIG. 10A, FIG. 10B, and FIG. 10C, each parallax direction is different and a detection capability in the angular direction of the object is different. Accordingly, if the pixels of the pattern of the lower electrode shown in FIG. 7, FIG. OA, FIG. 10B, and FIG. 10C are arranged in a periodically mixed manner in the xy plane of the image pickup device 101 shown in FIG. 8, for example, the focus detection capability can be improved.

Additionally, as shown in FIG. 10D, the pupil region 607B at the center may be an undivided shape. In this case, the phase difference focus detection may be performed in the pupil regions 607A and 607D.

In this way, in the pixel having the lower electrode corresponding to the pupil pattern, the readout region of the pixel signal is changed, and the addition method of the signals that have been read from each lower electrode is changed. Hence, images having a plurality of F-numbers can be simultaneously acquired by one shooting, and an image having a desired F-number can be acquired from among the images. The simultaneous acquisition of images having different F-numbers may be set by a user during the shooting operation, and may be processed in the camera (image pickup apparatus). Alternatively, after shooting, an external device such as a personal computer and an electronic terminal other than the camera (image pickup apparatus) may be used to perform post-processing, and an image having a desired F-number may be selectively formed.

Specifically, the image pickup device and the readout means for reading out signals from the image pickup device are built in the camera (image pickup apparatus). In contrast, the image signal processing means that performs addition processing to the readout signals to form an image signal for image recording or display may be built in the camera (image pickup apparatus) or may be built in an external device other than the camera (image pickup apparatus). Note that, in order to acquire images having different F-numbers during post-processing, while shooting, signals corresponding to the lower electrodes, for example, 209AS to 209DS, 309AS to 309DS, 409AS to 409DS . . . are read out independently and recorded temporarily. Subsequently, during post-processing, these signals are added or subtracted by a predetermined combination, so that images having different F-numbers can be acquired.

In this way, a plurality of pupil patterns having a pupil region corresponding to a shooting diaphragm and a pupil region having a parallax for focus detection are formed so that a shooting image corresponding to a plurality of F-numbers can be obtained by one shooting simultaneously with phase difference focus detection. Moreover, since the pupil region can be formed to be, for example, substantially circular, a natural blur shape can be obtained.

Embodiment 2

Next, in Embodiment 2, an example in which the number of divisions of the pupil region is higher than that of Embodiment 1 will be described with reference to FIGS. 11A to 11D. FIG. 11A illustrates a pattern of a lower electrode of Embodiment 2, and FIG. 11B schematically illustrates 12 pupil regions that have been divided. As described above, an arbitrary pupil pattern can be formed by using the pattern of the lower electrode that is a metal material. Thus, in the image pickup device having the photoelectric conversion film according to the present embodiment, the degree of freedom for the pupil pattern shape is high. Even the complicated pupil pattern shape shown in FIG. 11A in Embodiment 2 can be formed easier than a conventional CCD or CMOS image pickup device.

In the examples of FIG. 11A and FIG. 11B, the pupil region is divided into 12 portions from 707A to 707L, and as shown in FIG. 11B, the pupil regions 707C, 707F, 707, and 707L each has a circular shape divided into four portions, and the pupil regions 707B, 707E, 707H, and 707K each has a substantially annular shape divided into four portions. Additionally, the pupil regions 707A to 707L are regions having the shapes shown in FIG. 11B. As described above, these pupil shapes are similar to the shape of the lower electrodes of each pixel. Specifically, a photoelectric conversion region that corresponds to the pupil regions 707C, 707F, 707I, and 707L is formed to serve as a first region. Additionally, a photoelectric conversion region corresponding to the pupil regions 707B, 707E, 707H, and 707K, serving as an annular photoelectric conversion region provided outside the first region, is also formed. Note that a signal obtained from an annular photoelectric conversion region provided outside the first region is referred to as a fourth signal. Additionally, the pupil region 6073 is a pupil region determined by the open aperture of the shooting lens unit 500 as described above.

Figure 12:
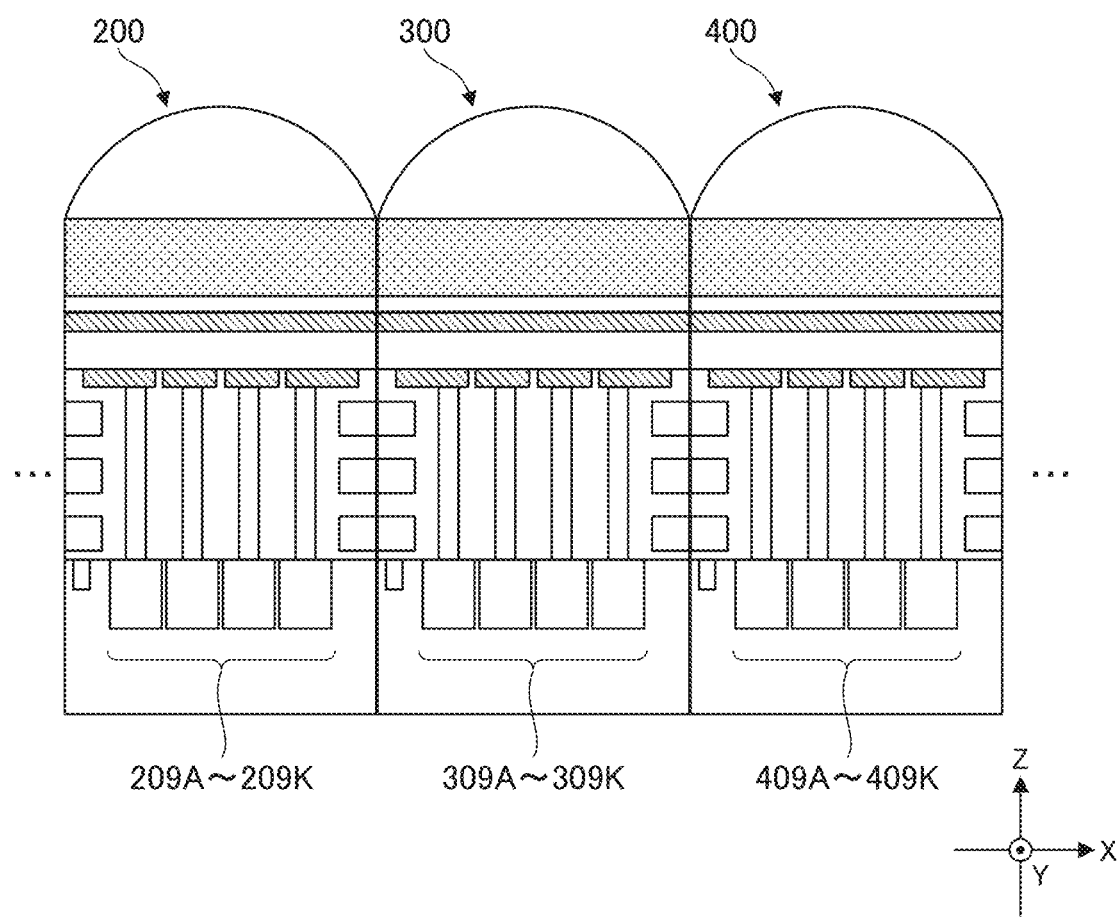
FIG. 12 is a sectional view of the pixels in the pixel arrangement according to Embodiment 2.

FIG. 12 illustrates an example of a cross-sectional configuration in the x direction passing through the center of the pixel corresponding to FIG. 11A, and relates to three pixels 200, 300, and 400 arranged as shown in FIG. 8. The lower electrode of each pixel is formed by a lower electrode divided into 12 portions, and each lower electrode has a similarity shape corresponding to the pattern of the pupil region shown in FIG. 11A. Additionally, each pixel also has 12 signal readout units, 209A to 209K, 309A to 309K, 409A to 409K . . . connected to each lower electrode. The signal-readout from the 12 signal readout units may be configured to read out signals individually or the signals may be read out after addition processing that may be performed on the signals in the image pickup device.

Images for image recording or display having three different F-numbers can be simultaneously acquired by one image pickup (shooting) by using the image pickup device having a lower electrode with a similar shape corresponding to the pupil regions as shown in FIG. 11A. For example, it is assumed that the open F-number of the shooting lens unit is F 2.0. Here, it is possible to acquire images having F 2.8 (first-step aperture) and F 4.0 (second-step aperture) at one time. A method for reading out signals from the pupil region at that time will be described below.

Note that the signals from the lower electrodes corresponding to the pupil regions 707A to 707L are defined as 707AS to 707LS. In the case of F 2.0, addition is performed, for example, as 707AS+707BS+707CS+707DS+707ES+707FS+707GS+707HS+707IS+707JS+707KS+707LS. Specifically, the first to fourth signals are used to form a first image signal. In the case of F 2.8, addition is performed, for example, as 707BS+707CS+707ES+707FS+707HS+707IS+707KS+707LS. Specifically, a third image signal is formed by using the first signal and the fourth signal, instead of using the second and third signals. Such a mode that forms the third image signal is referred to as a "third mode". In the present embodiment, the image processing means can select the third mode in addition to the first and second modes.

In the case of F 4.0, the image processing means performs addition, for example, as 707CS+707FS+707IS+707LS, to form the second image signal. In signal-readout from each pixel in FIG. 12, images having F-numbers, F 2.0, F 2.8, and F 4.0 on the image pickup device 101 can be obtained by generating the above-mentioned addition signals by using an image generating means.

Additionally, in focus detection, as described with reference to FIG. 6, parallax images having centroid position G_A to G_L are generated corresponding to each pupil region by using the focus detection means. At this time, various methods are conceivable for obtaining the image shift amount p of the object image between the parallax images. For example, the left half pupil region in FIG. 11A is obtained by the calculation 707 LEFT=707AS+707BS+707CS+707JS+707KS+707LS. In this case, the centroid position becomes G_LEFT=(G_A+G_B+G_C+G_J+G_K+G_L)/6. Furthermore, the right half pupil region is obtained by the calculation 707 RIGHT=707 DS+707ES+707FS+707GS+707HS+707IS. In this case, the centroid position becomes G_LEFT=(G_D+G_E+G_F+G_H+G_I+G_J)/6. The focus detection is performed by calculating the image shift amount p based on the G_LEFT and the G_RIGHT and obtaining the defocusing amount d.

Similarly, G_UP=(707AS+707BS+707CS+707DS+707ES+707FS)/6 is obtained by using the vertical parallax. Additionally, G_DOWN=(707GS+707HS+707IS+707JS+707KS+707LS)/6 is obtained. Focus detection in the vertical direction may be performed by calculating the image shift amount p based on these differences and obtaining the defocusing amount d.

In addition, for example, focus detection can be performed only by using parallaxes (for example, G_A and G_D.) by using the signals from a single pupil region for each or focus detection may be performed by using any other combination. In the image pickup device described in Embodiment 2, as shown in FIG. 11A, since pupil division in the vertical direction and pupil division in the horizontal direction are mixed, the combination of parallax images used during focus detection can be changed in various ways. Additionally, it may be possible to change the combination of the pupil regions for performing focus detection depending on, for example, a two-dimensional pixel position on the image pickup plane, an angular direction of the object, F-number during shooting, and a lens type to be mounted.

Next, the relation between the pupil regions 707A to 707L and the signal readout method in FIG. 11A will be described. As shown in FIG. 11A, if the number of the pupil divisions is increased and the image pickup device signals corresponding to the respective pupil regions are independently read out and stored in the camera, this is convenient when images having different F-numbers are generated in the post-processing (for example, a personal computer). However, the number of channels read out from the signal readout unit of FIG. 12 also increases accordingly. In the case of performing the signal readout, 12 channels are required for signal readout when the number of pupil division is 12 as shown in FIG. 11A.

In contrast, in order to reduce the number of readout channels and the amount of information to be stored in the storage medium 106 in performing processing in the camera, the following measures may be used. FIG. 11C and FIG. 11D illustrate seven kinds of pupil region FA to pupil region FC and pupil region SA to pupil region SD. As shown in FIG. 11C and FIG. 11D, seven kinds of pupil regions may be set, and the image pickup signals corresponding to these pupil regions may be read out. At that time, electric charges may be added in the circuit of the semiconductor substrate 208 of the image pickup device and read out.

That is, for the pupil region FA having a circular shape located at the center in FIG. 11C, 707CS+707FS+707LS+707IS is calculated. For the pupil region FB having an annular shape in FIG. 11C, 707BS+707ES+707HS+707KS+FAS is calculated. For the pupil region FC that is a dot region in FIG. 11C, 707AS+707DS+707GS+707JS+FBS is calculated. For the pupil region SA having a rectangular shape located at the upper left of FIG. 11D, 707AS+707BS+707CS is calculated. For the pupil region SB having a rectangular shape located at the upper right of FIG. 11D, 707DS+707ES+707FS is calculated. For the pupil region SC having a rectangular shape located at the lower right of FIG. 11D, 707GS+707HS+707IS is calculated. For the pupil region SD having a rectangular shape located at the lower left of FIG. 11D, 707JS+707KS+707LS is calculated.

In the above description, the pupil region FA is, for example, a pupil region corresponding to a shooting image having F 4.0. Since the pupil region FA+FB is a pupil region corresponding to a shooting image having F 2.8 and the pupil region FA+FB+FC represents the overall pupil region, the pupil region corresponds to the shooting image having F 2.0 (open). That is, in order to obtain the shooting images having a plurality of different F-numbers, pixel signals (a plurality of addition signals) corresponding to the pupil regions FA, FB, and FC are read out.

Next, the pupil region SA to the pupil region SD are used as pupil regions for focus detection. During phase difference focus detection, focus detection is performed by using, for example, parallax images of the pupil region SA+SB and the pupil region SC+SD, and a parallax is generated in the vertical direction, and thereby the phase difference focus detection described in Embodiment 1 can be performed.

Similarly, focus detection is performed by using parallax images of the pupil region SA+SD and the pupil region SB+SC and a parallax is generated in the horizontal direction, and thereby the phase difference focus detection described in Embodiment 1 can be performed. Phase difference focus detection can be performed by reading out pixel signals (a plurality of addition signals) respectively corresponding to the pupil regions SA, SB, SC, and SD. As described above, signals can be read out from the image pickup device with a number of channels that is smaller than the divided number of the pupil region (the divided number of the lower electrode) by using a plurality of addition signals, and as a result, it is possible to generate a captured image and perform phase difference focus detection.

It may be possible to obtain focus detection capabilities in the vertical direction and the horizontal direction simultaneously by changing and mixing various readout methods for focus detection as described above in each pixel unit or in units of a plurality of pixels arranged in the XY plane of the image pickup device shown in FIG. 8. Additionally, although, in FIG. 11A, the pupil region is divided along the X axis and the Y axis, the pupil region may be divided along an axis rotated by 45 degrees in the oblique direction of the X axis and the Y axis as shown in FIG. 13A. Additionally, as shown in FIGS. 13B and 13C, a shape in which the number of the divided portions for a part of the pupil region is small may be possible. The number of patterns of the lower electrode can be reduced by reducing the number of pupil divisions, and the number of readout channels from the image pickup device can be reduced. Therefore, it is possible to reduce, for example, the processing speed and the processing load.

Note that, in the above embodiments, although an example of forming a plurality of divided photoelectric conversion regions by the combination of the divided lower electrodes, the organic photoelectric conversion film 204, and the upper electrode has been described, the present invention is not limited to such a configuration. For example, the upper electrode may be divided into a plurality of portions, and a plurality of photoelectric conversion regions may be formed by the upper electrodes. In that case, the shape of the divided photoelectric conversion regions is determined depending on the shape of the divided upper electrodes. Additionally, for example, in an image pickup device in which an inorganic material is used for the photoelectric conversion unit, a plurality of photoelectric conversion regions may be formed by arranging a plurality of photodiodes beneath the micro lens in each pixel and forming a light receiving surface of each photodiode so as to have a shape similar to that in the present embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-020052, filed on Feb. 6, 2019, which is hereby incorporated by reference herein in its entirety.

What is claimed is:

1. An image processing apparatus comprising:
   an image pickup device configured to have a plurality of pixels arranged along an image pickup plane,
   the pixel having a micro lens for condensing light from outside into the pixel and a photoelectric conversion region provided beneath the micro lens and for generating a photoelectric conversion signal,
   the photoelectric conversion region including an upper electrode and a lower electrode sandwiching a photoelectric conversion film, the upper electrode or the lower electrode being divided into a plurality of portions, and forming at least a first region, a second region, and a third region that are divided and arranged in a plane parallel to the image pickup plane by the divided upper electrodes or the lower electrodes, the first region having a shape for forming a circle, the second region and the third region being arranged outside the first region; and
   a readout unit configured to read out the photoelectric conversion signals obtained by one image pickup operation to serve as respectively first, second, and third signals from the first, second, and third regions.

2. The image processing apparatus according to claim 1, further comprising an image signal processing unit configured to have a first mode that forms a first image signal by adding the first, second, and third signals from among the first, second, and third signals that have been read out by the readout unit, and a second mode that forms a second image signal by using the first signal without using the second and third signals.

3. The image processing apparatus according to claim 2, wherein the image pickup device and the readout unit are built in an image pickup apparatus, and the image signal processing unit is built in an external apparatus separate from the image pickup apparatus.

4. The image processing apparatus according to claim 1, further comprising a focus detection unit configured to generate a focus detection signal by using at least the second and third signals from among the first, second, and third signals that have been read out by the readout unit.

5. The image processing apparatus according to claim 1, further comprising a storage unit configured to store each of the first, second, and third signals that have been read out by the readout unit.

6. The image processing apparatus according to claim 1, wherein the first region is further divided into a plurality of regions.

7. The image processing apparatus according to claim 6, wherein the annular region is divided into a plurality of regions.

8. The image processing apparatus according to claim 1, wherein the photoelectric conversion region has an annular region provided outside the first region.

9. The image processing apparatus according to claim 8, wherein the readout unit reads out a fourth signal from the annular region.

10. The image processing apparatus according to claim 9, wherein the image processing unit can select a third mode that forms a third image signal by using the first signal and the fourth signal instead of using the second and third signals.

11. The image processing apparatus according to claim 1, wherein the photoelectric conversion region is divided into a plurality of regions, and the readout unit adds and reads out a part of signals of the regions.

12. The image processing apparatus according to claim 1, wherein the photoelectric conversion region is divided into a plurality of regions, and the readout unit has a storage unit for reading out and storing signals from the regions.

13. The image processing apparatus according to claim 12, further comprising a unit configured to change a combination of signals from the regions stored in the storage unit and perform addition.

14. The image processing apparatus according to claim 1, wherein the photoelectric conversion film includes an organic photoelectric conversion film.

15. An image processing apparatus comprising:
    an image pickup device having a plurality of pixels arranged along an image pickup plane, the pixel having a micro lens for condensing light from outside into the pixel and a photoelectric conversion region provided beneath the micro lens and for generating a photoelectric conversion signal,
    the photoelectric conversion region including an upper electrode and a lower electrode sandwiching a photoelectric conversion film, the upper electrode or the lower electrode being divided into a plurality of portions, and forming at least a first region, a second region, and a third region that are divided and arranged in a plane parallel to the image pickup plane by the divided upper electrodes or the lower electrodes, the first region having a shape for forming a circle, the second region and the third region being arranged outside the first region;

a readout unit configured to read out photoelectric conversion signals obtained by one image pickup operation to serve as respectively first, second, and third signals from the first, second, and third regions;

an image signal processing unit configured to have a first mode that forms a first image signal by adding the first, second, and third signals from among the first, second, and third signals that have been read out by the readout unit, and a second mode that forms a second image signal by using the first signal instead of using the second and third signals; and a focus detection unit configured to generate a focus detection signal by using at least the second and third signals.

* * * * *